United States Patent
Mak et al.

(10) Patent No.: US 7,185,247 B2
(45) Date of Patent: Feb. 27, 2007

(54) PSEUDO BUS AGENT TO SUPPORT FUNCTIONAL TESTING

(75) Inventors: Tak M. Mak, Union City, CA (US); Li Chen, La Jolla, CA (US)

(73) Assignee: Intel Corporation, Santa Clara, CA (US)

( * ) Notice: Subject to any disclaimer, the term of this patent is extended or adjusted under 35 U.S.C. 154(b) by 440 days.

(21) Appl. No.: 10/608,390

(22) Filed: Jun. 26, 2003

(65) Prior Publication Data
US 2004/0268200 A1    Dec. 30, 2004

(51) Int. Cl.
*G01R 31/28*    (2006.01)

(52) U.S. Cl. ...................... 714/724; 714/726
(58) Field of Classification Search .......... 714/40, 714/41, 742, 718, 724; 702/117
See application file for complete search history.

(56) References Cited

U.S. PATENT DOCUMENTS

| | | | | |
|---|---|---|---|---|
| 5,930,735 A | * | 7/1999 | Pun ........................... | 702/119 |
| 6,049,901 A | * | 4/2000 | Stock et al. ................. | 714/726 |
| 6,294,921 B1 | * | 9/2001 | Bonaccio et al. ........... | 324/756 |
| 6,377,065 B1 | * | 4/2002 | Le et al. ...................... | 324/765 |
| 6,424,926 B1 | * | 7/2002 | Mak ............................ | 702/117 |
| 6,510,398 B1 | * | 1/2003 | Kundu et al. ............... | 702/117 |
| 2003/0051197 A1 | * | 3/2003 | Evans ......................... | 714/718 |

\* cited by examiner

*Primary Examiner*—Albert Decady
*Assistant Examiner*—Saqib J. Siddiqui
(74) *Attorney, Agent, or Firm*—Schwegman, Lundberg Woessner & Kluth, P.A.

(57) ABSTRACT

Methods, systems, and apparatuses are provided to emulate bus transactions for a device under test (DUT). Test data is sent from a testing device to a cache of a DUT. When data needs to be read or written to locations outside of the cache (e.g., bus action is needed), a pseudo bus agent (PBA) is activated. The PBA emulates the reads or writes and provides pseudo data back to the cache. In some embodiments, results of bus transactions are compressed to form a bus signature that is provided back to the testing device for validation.

26 Claims, 5 Drawing Sheets

PSEUDO BUS AGENT TO SUPPORT FUNCTIONAL TESTING

TECHNICAL FIELD

Embodiments of the present invention relate generally to electronic data processing, and more particularly to functional testing of electronic devices.

BACKGROUND INFORMATION

Testing a semiconductor chip device (e.g., a device under test (DUT)) using a full pin count functional tester (tester) that mimics the remaining components of the devices is commonplace in the chip industry. As a DUT resets and fetches data from memory, the tester provides all the controls and instructions that are necessary for the DUT to operate properly. The tester also compares how the DUT behaves with pre-simulated behavior to detect faulty or slow circuits on the DUT. However, a prerequisite for testing is a high speed, high performance tester that is compatible with the DUT, both in bandwidth as well as signaling technologies.

High performance, full pin count testers are becoming increasingly more expensive and cost prohibitive in the competitive and low margin chip market. Furthermore, as a practical matter, customized testers are not timely available for use, since typically only short time windows are available for manufacturing and testing a DUT. These short time windows make it impractical that a customized tester be made available for timely testing. Moreover, it is not practical to design or purchase a customized tester for each class of DUTs. Correspondingly, it has become increasingly more popular to perform testing on a DUT on legacy testers having limited pin counts and slower performances than the DUT.

One conventional technique loads a cache with instructions and data for permitting the processor to execute directly from the cache, without bus access. This technique allows a legacy tester to be used for loading the cache with a low speed test port (shared with the functional pins). This removes the need for a full speed, full pin count tester, so that testing can be performed on the tester for a DUT having a much higher clock speed. Although this technique permits testing to be conducted in the first instance, it still does not address problems associated with testing for cache paging or other bus transactions. Cache paging and bus transactions are necessary for testing memory management and bus logic that is an increasing part of modern complex microprocessor architectures.

The technique described above that executes diagnostic tests directly from a cache of a DUT is referred to as a structural based functional test (SBFT). Thus, a SBFT needs to avoid sending any read/write cycles to the bus, since there may be no tester pins for performing the necessary handshaking in order for a bus transaction to be completed. Alternatively, the bus can be supplied by the tester to the DUT using a limited number of tester pins and de-multiplexing the full pin count of the DUT. But this de-multiplexing interaction can substantially slow the throughput of the test, and not adequately test the highest speed with which the bus should be functioning. A similar situation exists for a functional random instruction test for speed (FRITS) (random instructions during test (FRITS) versus programmed instructions during test used with (SBFT)).

Therefore, there is a need for improved bus interactions between a DUT and a tester.

DESCRIPTION OF THE EMBODIMENTS

Novel methods, systems, and apparatuses for emulating and validating bus transactions are described. In the following detailed description of the embodiments, reference is made to the accompanying drawings, which form a part hereof, and in which are shown by way of illustration, but not limitation, specific embodiments of the invention that may be practiced. These embodiments are described in sufficient detail to enable one of ordinary skill in the art to understand and implement them. Other embodiments may be utilized; and structural, logical, and electrical changes may be made without departing from the spirit and scope of the present disclosure. The following detailed description is, therefore, not to be taken in a limiting sense, and the scope of the embodiments of the inventions disclosed herein is defined only by the appended claims.

Figure 1A:
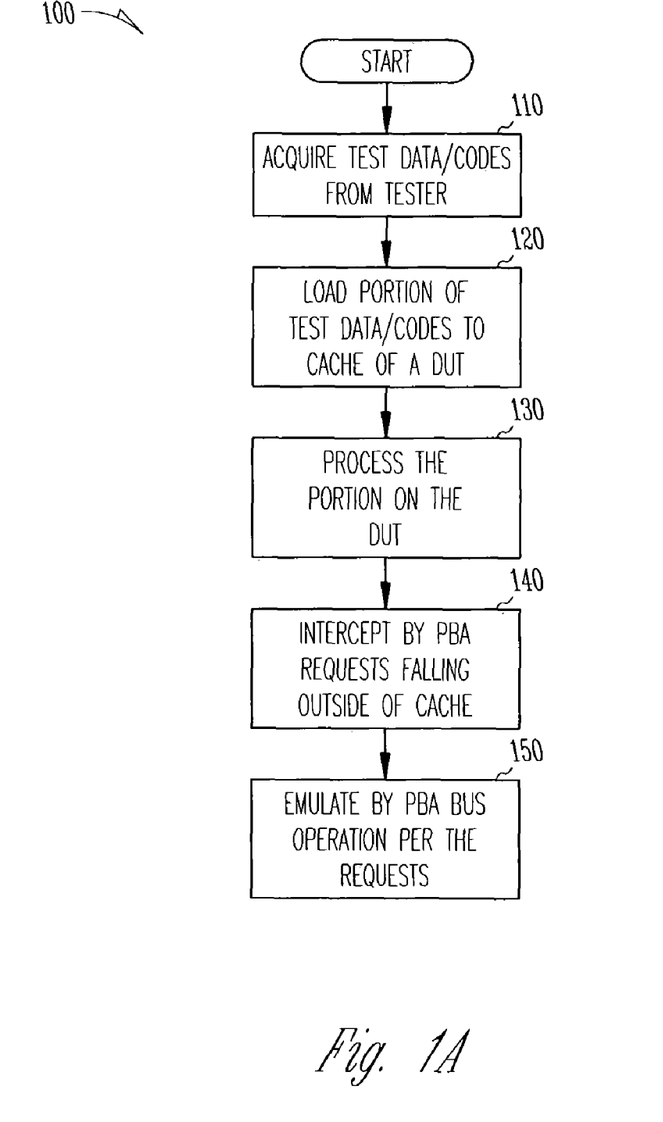
FIGS. 1A and 1B are flow diagrams of a method to emulate bus transactions, in accordance with one embodiment of the invention.
Figure 1B:
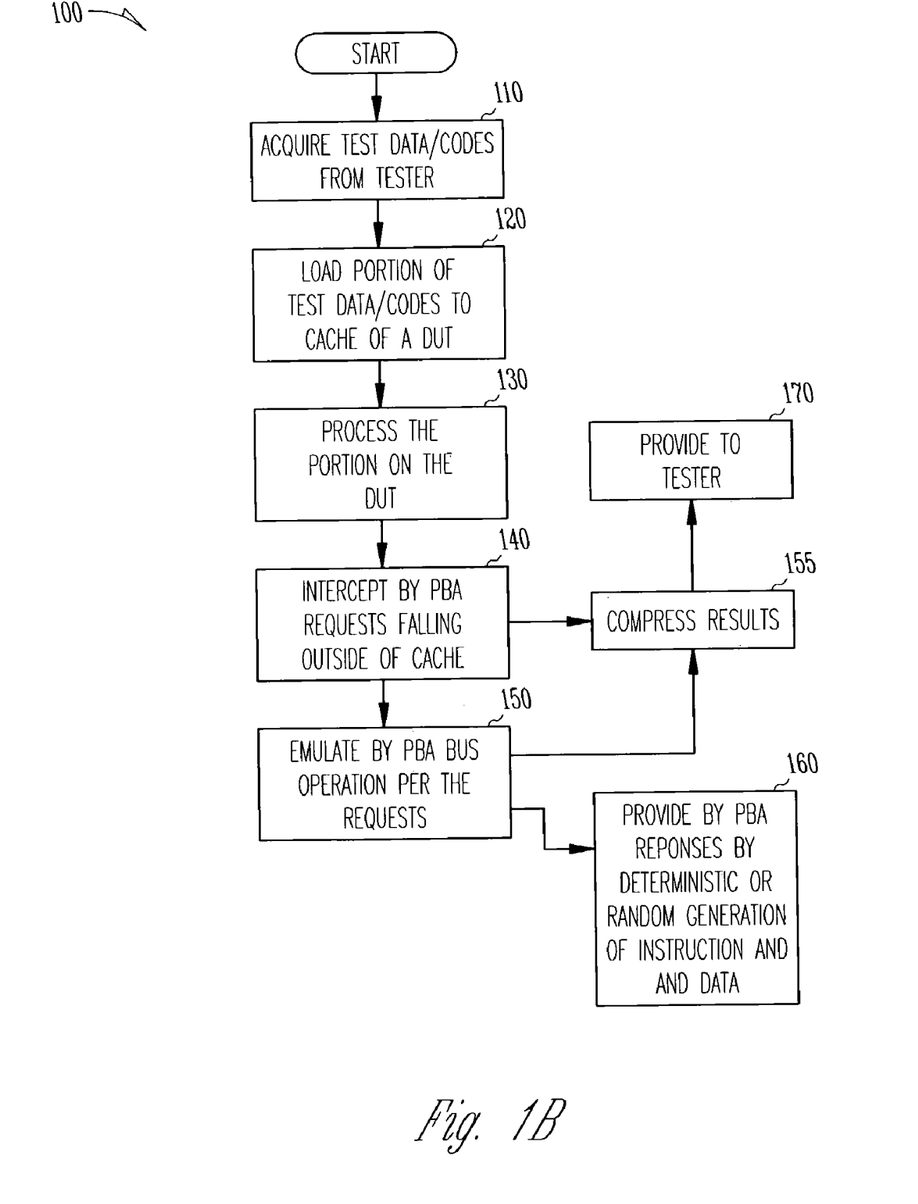

FIGS. 1A and 1B are flow diagrams of one method 100 to emulate bus transactions for a device under test (DUT). A DUT can be any processor enabled device (e.g., electronic device having processing capabilities) with one or more processors, registers, and memory for executing instructions. A DUT is loaded onto a tester for testing. The testing is defined by test instructions and test data that can be provided by using a SBFT or FRITS. Thus, a specific test is defined by test data defined on or initially loaded on the tester.

The tester includes one or more interfaces that permit an operator to initiate, load, develop, validate, and monitor test data that is processing on a DUT. Often specific tests determine whether the DUT will issue cache paging requests, manage memory, perform reads, and perform writes properly. The actual data content associated with performing an operation is usually not important; rather, testing whether a specific operation was properly carried out by the DUT is a proper test item. For example, determining whether the value of a memory location is "5" is not as important as determining that the DUT issued a read request for the memory location.

The DUT and the tester are typically interfaced via ports and buses of the DUT and the pin electronics of the tester. In many circumstances, the tester will have less pin electronics than the number of port and bus pins that are necessary to test the DUT. Thus, a number of the port and bus pins associated with the DUT will not be directly connected to the tester. Conventionally, when a tester does have the full pin electronics that match the DUT, all read and write operations are serviced by stored stimulus in the tester's memory. Embodiments of the present invention do not require any such responses from a tester to service requests.

At 110, test data is acquired from the tester via the connected port pins of DUT to the tester. In some embodiments, the test data is serially streamed to the DUT and begins self executing after a certain amount of test data has been buffered on the DUT. In other embodiments, the test data is completely acquired from the tester before the test data is loaded and executed on the DUT.

At 120, at least a portion of the test data is loaded into a cache of the DUT. Furthermore, at 130, the portion of test data loaded in the cache is processed on the DUT. During processing, a number of the instructions associated with the test data may require a cache paging operation, a memory read operation, or a memory write operation over the bus. In other words, a memory location targeted for a read or writes may reside outside the cache and require some action over the bus. When this occurs, the bus takes over to service the needed action. If the testing can continue independent of the needed action, then testing will proceed. However, in some instances, the processor may need to wait for the needed action to be serviced by the bus. Conventionally, the needed action would cause the bus unit to issue the request back to the tester where action would need to be taken to supply data back to the cache indicating the results of performing the desired operation. These bus operations are conventionally necessary in order to demonstrate that the DUT is capable of performing the necessary memory management and memory read/write operations.

At 140, any testing instructions that cause a cache paging operation or other bus operation to occur is intercepted by a pseudo bus agent (PBA). The PBA can be implemented as hardware (on an electronic chip or on a test interface board), firmware, software, or a combination of hardware, firmware, and software within the DUT. In other embodiments, the PBA is separate from the DUT but coupled to the DUT (e.g., on a test interface board) prior to conducting a test. The PBA establishes deterministic handshaking with the DUT utilizing most of the existing and externally visible bus/address/data/control signals as input. Moreover, the handshaking logic can be implemented as a state based machine. Internal bus control signals need not be used. In this manner, the PBA need not be tied to any particular or specific design associated with a DUT. The design can be used across generations of processors that have a similar bus interface.

The PBA emulates a bus transaction during testing and provides substantially uninterrupted responses to the DUT when cache misses or other bus actions are detected in the test data by the DUT. This is done by providing the cache or the processor with data in a format expected by the initial bus transaction request. The content of the data is not significant for purposes of testing rather the fact that response data is provided back in a proper format (e.g., confirmation number that an operation performed, a 32 bit number, and the like) is relevant.

The PBA can generate data in a proper format in response to a bus transaction in a number of ways. For example, a data read source can be provided or identified within the DUT as a set of registers that can be loaded by the tester before any test proceeds on the DUT. Another technique is to provide a set of processor accessible registers. This would permit the processor of the DUT to re-program instructions to jump to where changes can occur with different iterations of a test (e.g., a FRITS execution test). Still another technique would utilize the data registers to acquire previous data, which is read back in as instructions. The PBA can deterministically or randomly generate data or select data sources for providing responses for a bus transaction.

Thus, at 150, the PBA provides pseudo test data to emulate the processing of an initial requested bus operation. The pseudo test data can be selected or randomly generated as depicted at 160. Moreover, at 160, the pseudo test data can be predetermined or designed to be deterministically resolved. In this way, the PBA provides continuous and substantially uninterrupted responses (at a memory response rate expected by the DUT) to the DUT for a test, without the need for the tester to supply data at a defined speed. As a result, a DUT can be used with conventional limited pin count testers to achieve more efficient speed testing of the DUT. Further, the PBA improves memory management and bus unit testing, which has conventionally been a testing problem. Moreover, the PBA can be installed or designed into any class of DUTs.

In more embodiments, at 155, results associated with performing the tests are compressed to form a bus transaction signature. One technique for doing this compression is by exclusively OR'ing together the results of any two test transactions contained within a test. The new result can then be exclusively OR'ed again against another transaction. This can occur for a configurable or desirable number of iterations, such that the entire test results of a test on a DUT can be represented as a single one word or two word signature. The signature can be provided back to the tester at 170 and checked against an expected signature. The expected signature can be known to the tester. Of course any compression technique can be used for various embodiments of the present invention (e.g., checksum values), and the above example was presented for purposes of illustration only and was not intended to be limiting.

Embodiments of method 100 permit a DUT to utilize a generically developed PBA that emulates bus transactions when cache paging (e.g., misses or jumps) occurs or when other bus transactions are needed. The PBA provides near continuous and uninterrupted responses (at a memory response rate expected by the DUT) to the DUT during a test without the need to have complex de-multiplexing logic on a test interface or a full speed, full pin count tester. Correspondingly, the amount of tester memory resources can be reduced since much of the responses are provided by the PBA. Moreover, testing can now occur for other bus transactions, which were previously avoided due to the low bandwidth of the tester.

Figure 2:
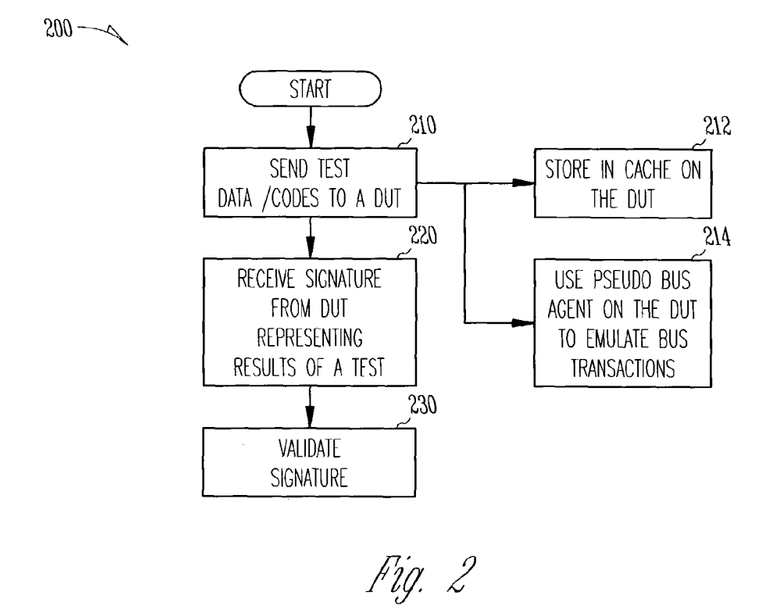
FIG. 2 is a flow diagram of a method to validate a bus transaction signature, in accordance with one embodiment of the invention.

In FIG. 2 a tester implementing method 200 sends test codes to a DUT at 210. The test codes are stored on a cache of the DUT for manipulation and processing of the test defined by the test codes, as depicted at 212. Moreover, the DUT includes a PBA and uses the PBA, at 214, on the DUT in order to emulate bus transactions. That is, the PBA emulates bus transactions without actually performing the bus transaction (accessing a memory controller, generating a Row Access Strobe (RAS) and Column Access Strobe (CAS) for memory banks), which may be dictated by the test codes. The DUT stores and processes the test data in a cache of the DUT and does not need to query the tester for bus transaction responses or results. Responses associated with the bus transactions are provided in a data format expected by the PBA to the DUT. The PBA achieves this by deterministically or randomly generating or selecting data to provide as responses to the DUT for bus transaction requests. Bus transactions are automatically generated when data is not present in the cache of the DUT or when some action is required by an external bus agent during testing.

As the instructions associated with the test codes are processed from the cache of the DUT, bus transactions are generated. Any bus transaction generated in the DUT or PBA are compressed by the DUT into a bus transaction signature. Accordingly, at 220, the signature representing the bus transaction signature is received. The DUT can compress or generate a signature in a number of ways (e.g., checksums), and all such compression techniques are intended to fall within the scope of various embodiments of the present invention.

The received signature from the DUT is then validated at 230. Validation can occur by matching the received signature against a saved and expected signature. Of course other validation techniques can be used beyond a signature, such as checksum computations and the like (e.g., where the signature is a running checksum value).

Testers implementing method 200 can validate test results by checking a single DUT provided signature that represents the test results performed on the DUT. Moreover, the tester need not be consulted by the DUT, since bus transactions are emulated by a PBA on the DUT. In this way, a tester can carry out a rapid comparison using a simple signature, which can be more readily validated with the embodiments and teachings of the present invention. Additionally, memory management and other bus transactions can now be more completely tested, since the bus will have an agent to respond to.

Figure 3:
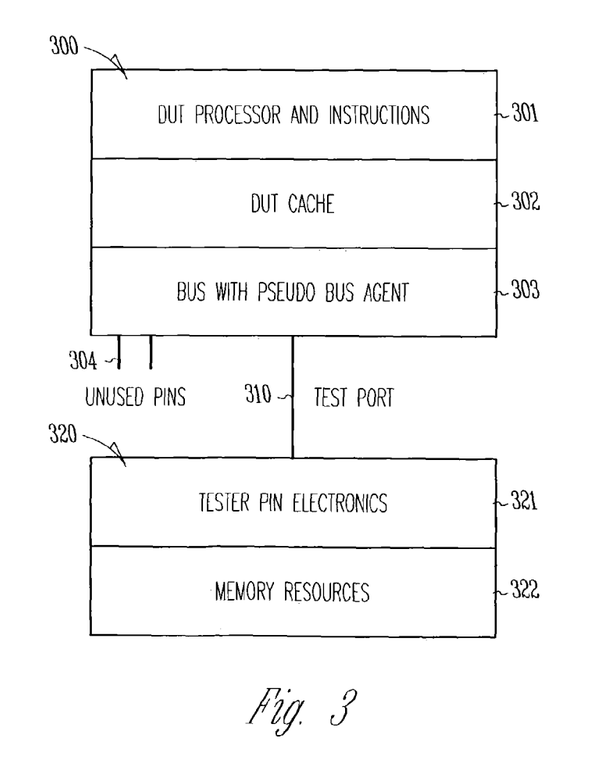
FIG. 3 is a diagram of a system to emulate bus transactions, in accordance with one embodiment of the invention.

FIG. 3 is a diagram of one system 300 to emulate bus transactions, in accordance with one embodiment of the invention. The system 300 is implemented within a DUT 300. The DUT 300 is interfaced via one or more port and bus pins 310 to a tester 320 when a test is desired. The DUT 300 includes a processor 301 (having hardware, firmware and/or software), a cache 302, and a bus interface with a PBA 303. Furthermore, in some embodiments, a number of port pins and bus 304 are not directly connected to the tester 320. Additionally, in other embodiments, the processor 301, the cache 302, and the bus interface are temporarily coupled to the DUT 300 for purposes of conducting a test (not shown in FIG. 3). Also, because the DUT 300 receives substantially uninterrupted responses (at a memory response rate expected) from the PBA 303, the DUT 300 uses less tester 322 memory because it does not need to store all the test data/codes required from the DUT 300.

The tester 320 includes a testing bus interface 320 in communication with a number of port and bus pins 310 of the DUT 300. The tester 320 includes memory resources 322. A desired or canned test to perform on the system 300 is represented as instruction and control data, which can be acquired or defined on the tester 320. The test data is then sent over the connected port and bus pins 310 from the tester 320 to the DUT 300 using the tester's tester bus interface (pin electronics) 321. This test data is received by the system 300 through its port and bus interface 303, and the test data is stored in the cache 302, where it is processed to perform the tests defined by the test data in the processor 301.

The test data can represent a SBFT or FRITS test. As the processor 301 executes the test data in the cache 302, test statements (defined in the test data) will generate bus transactions (e.g., such as when required data resides outside the cache or other action is needed). Under these conditions, rather than having the bus unit interact over the port and bus pins 310 and pin electronics 303 to the tester 320, the PBA 303 intercepts the bus requests and generates pseudo data in response to the bus requests and provides the pseudo data back to the processor 301 via the cache 302. Thus, the test data residing in the cache 302 continues to process nearly instantaneously (or at expected memory response time rates) and uninterrupted by the processor 301. The pseudo data can be deterministically or randomly selected from predefined registers, data registers, and other resources. Moreover, the pseudo data can be randomly generated from scratch by the PBA 303.

In some embodiments, the processor 301 of the DUT 300 can use test results that are being generated from processing the test data to generate a unique signature associated with completing the test successfully. This signature can be thought of as a compressed signature (or other unique value (e.g., checksum value)) for the test data results. The signature can be independently validated by the tester 320 for purposes of validating the tests performed on the DUT 300.

Figure 4:
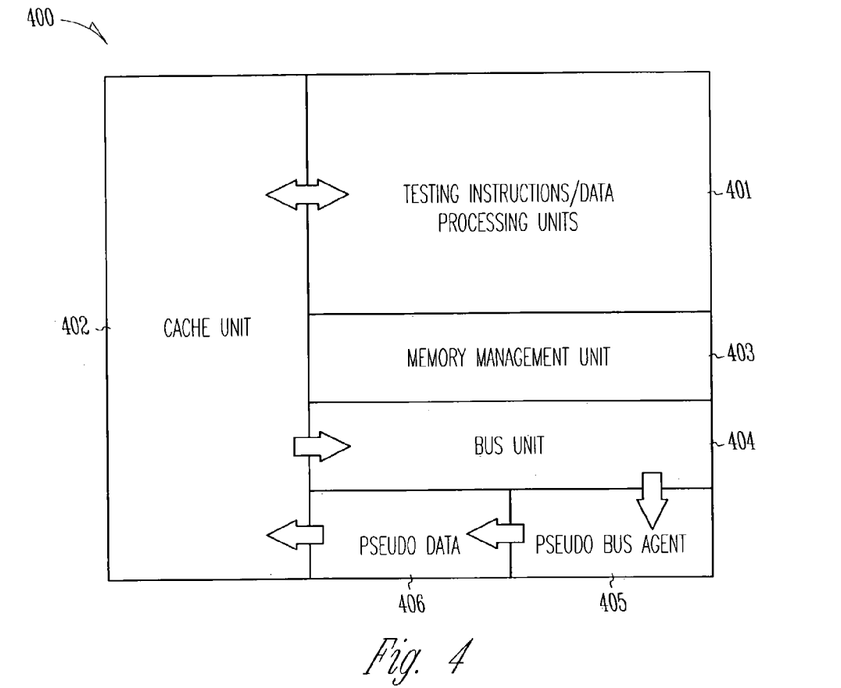
FIG. 4 is a diagram of an apparatus to emulate bus transactions, in accordance with one embodiment of the invention.

FIG. 4 is a diagram of one apparatus 400 to emulate bus transactions, in accordance with one embodiment of the invention. The diagram of FIG. 4 is presented for purposes of illustration only, since a variety of additional configurations can be made without departing from embodiments of the invention. The apparatus 400 can be viewed as a machine accessible medium that includes instructions represented by the arrows of FIG. 4 for performing processing, which logically represents a machine for emulating a bus transaction. The machine accessible medium can be any computer-accessible medium, such as magnetic or optical. Moreover, the computer-accessible medium can be physically attached to the machine or reside on external media interfaced to the machine. The machine can be any processing device.

The machine includes testing instruction/data embedded with processing units 401, a cache 402, a memory management 403, a bus unit 404, a PBA 405 (or an address or pointer to a PBA 405), and pseudo data 406. The testing data 401 is received from a testing device (tester) and can represent a SBFT or FRITS test. Furthermore, the testing data 401 is housed in the cache 402.

Once the test data 401 is loaded into the cache 402 a processor executes a portion of the test data 401 identified as instruction/code data in order to carry out the tests defined by the test data 401. During this processing, the memory management component 403 generate bus actions associated with processing the test data 401, which requires some data to be read from or written to a location requiring access over a bus unit 404. These requests are received by the PBA 405 and serviced using pseudo data 406 to provide responses back into the cache 402, in a near uninterrupted fashion or at a response rate expected for memory operations.

The pseudo data 406 satisfies the bus transaction requests originally generated by processing the test data 401 from the cache 402 or other bus transactions occurring over the bus unit 404. The pseudo data 406 can be deterministically or randomly generated within the machine; or it can be selected from resources associated with the machine 400.

The pseudo data 406 is provided back to the cache 402 in a format that is expected by the test data 401 being executed. In other words, when the test data 401 is expecting a return code indicating that a bus read/write successfully occurred, the pseudo data 401 is provided in a return code format. The content associated with a read operation can be deterministically or randomly generated, since the value of the content is not vital to the test being performed rather the fact that a read operation requests was issued and processed is more useful for purposes of validating the tests. Thus, the PBA 405 emulates test operations that are suppose to be processed over the bus unit 404, but the PBA 405 does not carry out the full duty of a memory agent (e.g., memory controller with banks of memory behind it).

Figure 5:
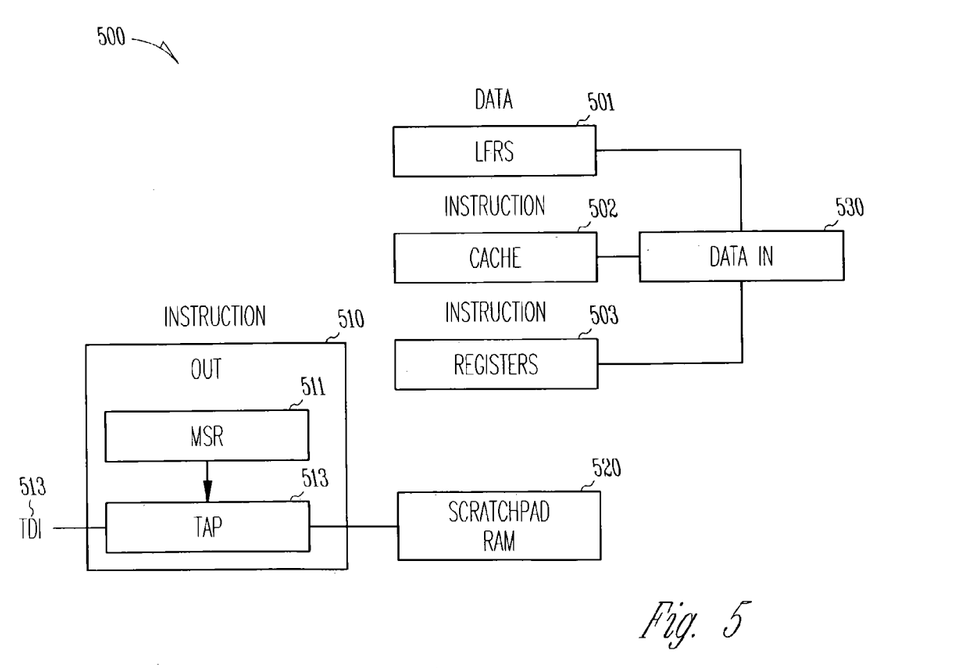
FIG. 5 is a block diagram for deterministically acquiring pseudo bus data, in accordance with one embodiment of the invention.

FIG. 5 is a block diagram 500 for deterministically or randomly acquiring pseudo bus data, in accordance with one embodiment of the invention. The block diagram depicts how a PBA can process to deterministically or randomly acquire pseudo data. The pseudo data is provided to a DUT in response to a previously requested bus transaction or cache paging operation. FIG. 5 is presented for purposes of illustration only. A variety of other configurations of a PBA can be used with various other embodiments of this invention. Therefore, FIG. 5 is intended to be illustrative and not limiting.

The pseudo data is depicted as block 530 in FIG. 5. In one embodiment, a PBA uses a Linear Feedback Shift Register (LFSR) 501 to generate pseudo random data 530. Thus, a specialized hardware or firmware microprocessor components can permit the PBA to randomly generate pseudo bus data 530 that is supplied as data input to a DUT. This randomly generated pseudo data 530 is supplied in response to a generated bus transaction or cache page that occurs during testing on the DUT.

Alternatively, the PBA can provide deterministic data and instructions sourced from a specific cache 502 location. The result of processing this set of instructions demonstrates that the DUT is capable of jumping or branching to different part of the memory and execute from there. This instruction sequences need to perform enough of the execution to show that the jumping and branching mechanism are in fact defect free, and then hands the control back to the test codes running in the cache.

In still more embodiments, the PBA can source these instructions residing in one or more registers 503 that are pre-loadable from the tester. Another embodiment would have the instructions/data be loaded via a Test Data Input pin (TDI) 513 of the Test Access Port (TAP) 512 and is temporarily held as Scratchpad memory area 520, where the instructions/data become responses to the DUT as data input.

In yet another embodiment, the PBA can execute an instruction to deterministically acquire data directly from a Model Specific Register (MSR) 511, which is architecturally visible to the PBA. This will then be modifiable by the test codes themselves and subsequently be sent back to the bus unit as a response to the bus request. This is essentially self modifying code to verify the whole bus architecture and memory management functionality.

FIG. 5 illustrates how a PBA can be configured to randomly or deterministically source pseudo data and instructions 530, which is needed by a DUT as input representing a result of a test codes that generated a bus transaction or cache page operation. Thus, a PBA can use specialized devices or instructions 501 to randomly generate pseudo data 530. Furthermore, the PBA can deterministically source and process instructions from a cache 502 or registers 503 to provide pseudo data and instructions 530. Moreover, the PBA can execute codes to deterministically generate the deterministic instruction sequence 530 through a MSR 511. Other techniques can also be used and are intended to be included as embodiments of this invention.

Figure 6:
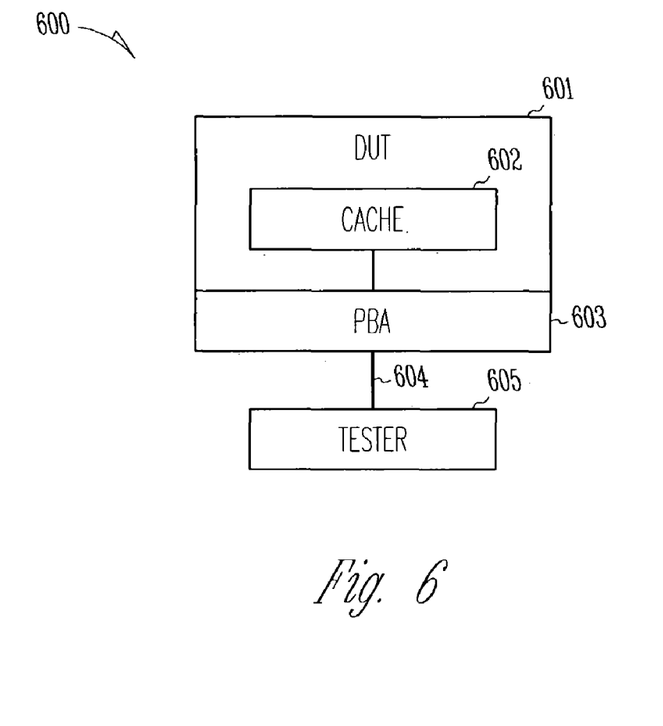
FIG. 6 is a block diagram of an apparatus for emulating bus transactions, in accordance with one embodiment of the invention.

FIG. 6 depicts a block diagram of an apparatus 600 for emulating bus transactions. The apparatus 600 is implemented in a computer-accessible medium or media. Various components of the apparatus 600 can be implemented within a machine representing a DUT 601.

The apparatus 600 includes a DUT 601 having a cache 602 in communication with a PBA 603. The DUT 601 communicates via a testing port 604 to a tester device 605. The tester 605 supplies testing instructions via the testing port 604 to the cache 602 of the DUT 601. The DUT 601 then executes the test instructions for purposes of completing a test that is identified by the instructions.

During testing on the DUT 601, a number of the instructions that are being executed will cause a cache paging operation or other bus operation to be requested from the DUT 601 to the PBA 603. Under these conditions, the PBA 603 does not need to seek guidance from the tester 605 using the testing port 604; rather, the PBA 603 randomly or deterministically generates pseudo data to satisfy the cache page or bus operation being requested by the DUT 601.

Thus, a bus unit associated with the DUT 601 does not become overloaded with bus transactions and does not need to access the testing port 604 in order to continue with testing on the DUT 601, since the PBA 603 emulates the needed cache and bus operations. This emulation provides near uninterrupted responses to the DUT 601 during testing for each cache page and bus operation being generated by the testing instructions.

In one embodiment, results associated with emulating bus transactions and executing the testing instructions on the DUT 601 can be compressed as a single digital signature. The DUT 601 then sends this signature to the tester 605 via the testing port 604. The tester 605 validates the signature to satisfy itself that testing went as expected on the DUT 601 with the provided testing instructions.

The above description is illustrative, and not restrictive. Many other embodiments will be apparent to those of skill in the art upon reviewing the above description. The scope of embodiments of the invention should therefore be determined with reference to the appended claims, along with the full scope of equivalents to which such claims are entitled.

The Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing description of the embodiments, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject mater lies in less than all features of a single disclosed embodiment. Thus the following claims are hereby incorporated into the Description of the Embodiments, with each claim standing on its own as a separate exemplary embodiment.

What is claimed is:

1. A method, comprising:
   acquiring test data from a testing device;
   loading at least a portion of the test data to a cache onto a device under test;
   processing the portion of the test data in the cache on the device under test; and
   intercepting requests associated with other data falling outside of the cache by a pseudo bus agent to emulate a bus operation for an intercepted request, wherein the emulated bus operation reflects a test associated with a cache page operation of the cache.

2. The method of claim 1 wherein acquiring further includes deterministically or randomly generating the test data by the pseudo bus agent.

3. The method of claim 1 wherein acquiring further includes acquiring the test data by selecting a data source within the device under test.

4. The method of claim 1 further comprising compressing results associated with the processing and the intercepting on the device under test.

5. The method of claim 4 further providing the compressed results to the testing device by the device under test.

6. The method of claim 4 wherein compressing includes representing the compressed results as a digital signature for the test data.

7. A method, comprising:
sending test data to a cache on the device under test;
receiving from the device under test a signature associated with results of the test data, wherein at least a portion of the results is associated with testing an emulation of a cache paging operation associated with a cache of the device under test using a pseudo bus agent; and validating the signature against an expected signature.

8. The method of claim 7, further comprising using a pseudo bus agent, by the device under test, to emulate data traffic on a bus of the device under test when the test data is processed on the device under test.

9. The method of claim 7, further comprising storing, by the device under test, at least a portion of the test data in a cache on the device under test.

10. The method of claim 9 wherein storing includes servicing requests, by the pseudo bus agent, for other data residing outside the cache by providing responses back to the cache.

11. The method of claim 7 wherein receiving includes representing the signature as a compressed version of the results.

12. A system, comprising:
a cache;
a pseudo bus agent; and
a processor for executing instructions associated with test data in the cache;
wherein the test data is received from a testing device and the pseudo bus agent emulates responses from a bus as if the responses had originated from the bus during the execution of the test data, and wherein at least one response emulated reflects a cache page operation associated with the cache.

13. The system of claim 12 wherein the pseudo bus agent generates deterministic or random data to emulate the responses from the bus.

14. The system of claim 12 wherein the pseudo bus agent selects data from a variety of data sources to emulate the responses from the bus.

15. The system of claim 12 wherein processor logic generates a signature for test data results.

16. The system of claim 12 wherein the bus is in communication with the testing device.

17. The system of claim 12 wherein the test data includes instruction data.

18. A machine accessible medium having associated data, which when accessed, results in a machine performing:
Receiving a request for data on the pseudo bus agent in order to service a cache of the machine;
generating pseudo data in response to the request, wherein at least a portion of the pseudo data reflects a response for testing a cache page operation associated with the cache of the machine; and
providing the pseudo data in the cache to satisfy the request.

19. The medium of claim 18, wherein the data further includes data, which when accessed, results in the machine performing: acquiring the pseudo data from another resource of the machine.

20. The medium of claim 18, wherein the data further includes data, which when accessed, results in the machine performing: deterministically or randomly generating the pseudo data in the machine.

21. The medium of claim 18, wherein the data further includes data, which when accessed, results in the machine performing: representing the pseudo data as a return value associated with a write operation request.

22. The medium of claim 18, wherein the data further includes data, which when accessed, results in the machine performing: representing the pseudo data in a format expected by the request having a pseudo data value that represents a deterministic or random data value associated with a read operation request.

23. The medium of claim 18, wherein the data further includes data, which when accessed, results in the machine performing: using the pseudo data to emulate a bus transaction over the bus.

24. An apparatus comprising:
a cache for a device under test (DUT); and
a pseudo bus agent (PBA);
wherein the cache houses instructions for testing the DUT and the PBA services requests generated by a number of executing instructions when bus transactions are needed, the PBA services the requests by emulating the corresponding bus transactions and provides emulated results back to the cache, wherein a least a portion of the results reflects an emulated one of the bus transactions associated with a cache page operation of the cache.

25. The apparatus of claim 24 wherein the emulated results are compressed into a signature.

26. The apparatus of claim 25 wherein the DUT sends the signature to a tester when testing is complete for verification.

* * * * *

UNITED STATES PATENT AND TRADEMARK OFFICE
CERTIFICATE OF CORRECTION

| | |
|---|---|
| PATENT NO. | : 7,185,247 B2 |
| APPLICATION NO. | : 10/608390 |
| DATED | : February 27, 2007 |
| INVENTOR(S) | : Mak et al. |

It is certified that error appears in the above-identified patent and that said Letters Patent is hereby corrected as shown below:

In column 10, line 43, in Claim 24, before "least" delete "a" and insert -- at --, therefor.

Signed and Sealed this

Eighth Day of May, 2007

JON W. DUDAS
*Director of the United States Patent and Trademark Office*